US012193180B2

(12) United States Patent
Tseng et al.

(10) Patent No.: US 12,193,180 B2
(45) Date of Patent: Jan. 7, 2025

(54) ELECTRONIC DEVICE

(71) Applicant: Innolux Corporation, Miao-Li County (TW)

(72) Inventors: Ming-Chun Tseng, Miao-Li County (TW); Kung-Chen Kuo, Miao-Li County (TW); Yi-Hua Hsu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 313 days.

(21) Appl. No.: 17/743,466

(22) Filed: May 13, 2022

(65) Prior Publication Data

US 2022/0400566 A1    Dec. 15, 2022

Related U.S. Application Data

(60) Provisional application No. 63/210,503, filed on Jun. 15, 2021.

(30) Foreign Application Priority Data

Feb. 18, 2022   (CN) .......................... 202210153512.6

(51) Int. Cl.
H05K 5/02       (2006.01)
G09G 3/00       (2006.01)
H05K 5/00       (2006.01)

(52) U.S. Cl.
CPC ........... H05K 5/0247 (2013.01); G09G 3/006 (2013.01); H05K 5/0021 (2013.01)

(58) Field of Classification Search
CPC .... H05K 5/0247; H05K 5/0021; G09G 3/006; H01L 27/124
See application file for complete search history.

(56) References Cited

U.S. PATENT DOCUMENTS 10,114,601 B2 * 10/2018 Meersman ............... G09G 3/32
11,444,120 B2 *  9/2022 Xi ....................... G02F 1/13458
(Continued)

FOREIGN PATENT DOCUMENTS

| CN | 107924653 | 4/2018 |
| CN | 111200914 | 5/2020 |
| CN | 105723444 | 7/2020 |

OTHER PUBLICATIONS

"Office Action of Taiwan Counterpart Application", issued on Feb. 22, 2023, p. 1-p. 5.
(Continued)

Primary Examiner — Sardis F Azongha
(74) Attorney, Agent, or Firm — JCIPRNET

(57) ABSTRACT

The disclosure provides an electronic device including a support plate and a first panel. The support plate includes a first bridge member and a second bridge member. The first panel is disposed on the support plate and includes a substrate, a signal line, a third bridge member, and a fourth bridge member. The signal line is disposed on the substrate. The third bridge member penetrates through the substrate and is electrically connected to the signal line and the first bridge member. The fourth bridge member penetrates through the substrate and is electrically connected to the signal line and the second bridge member.

18 Claims, 11 Drawing Sheets

(56) References Cited

U.S. PATENT DOCUMENTS

| | | | |
|---|---|---|---|
| 11,741,886 B2* | 8/2023 | Song | G09G 3/32 |
| | | | 345/55 |
| 2016/0267835 A1 | 9/2016 | Meersman | |
| 2018/0254226 A1* | 9/2018 | Iguchi | H01L 27/156 |

OTHER PUBLICATIONS

"Office Action of China Counterpart Application", issued on May 22, 2024, p. 1-p. 8.

* cited by examiner

ELECTRONIC DEVICE

CROSS-REFERENCE TO RELATED APPLICATION

This application claims the priority benefit of U.S. application Ser. No. 63/210,503, filed on Jun. 15, 2021, and China application serial no. 202210153512.6, filed on Feb. 18, 2022. The entirety of each of the above-mentioned patent applications is hereby incorporated by reference herein and made a part of this specification.

BACKGROUND

Technical Field

The disclosure relates to an electronic device.

Description of Related Art

As the application of large-sized electronic devices (e.g., public information displays (PIDs)) has become more and more popular, the demand for tiling panels into larger-sized electronic devices is also increasing. Therefore, how to provide a reliable signal transmission method in an electronic device tiled with a plurality of panels is one of the techniques that have been vigorously developed in recent years.

SUMMARY

The disclosure provides an electronic device that may provide a reliable signal transmission method.

According to an embodiment of the disclosure, an electronic device includes a support plate and a first panel. The support plate includes a first bridge member and a second bridge member. The first panel is disposed on the support plate and includes a substrate, a signal line, a third bridge member, and a fourth bridge member. The signal line is disposed on the substrate. The third bridge member penetrates through the substrate and is electrically connected to the signal line and the first bridge member. The fourth bridge member penetrates through the substrate and is electrically connected to the signal line and the second bridge member.

In order to make the above features and advantages of the disclosure better understood, embodiments are specifically provided below with reference to figures for detailed description as follows.

BRIEF DESCRIPTION OF THE DRAWINGS

The accompanying drawings are included to further understand the disclosure, and the drawings are incorporated in the specification and constitute a part of the specification. The drawings illustrate embodiments of the disclosure and, together with the description, serve to explain principles of the disclosure.

DESCRIPTION OF THE EMBODIMENTS

Figure 1:
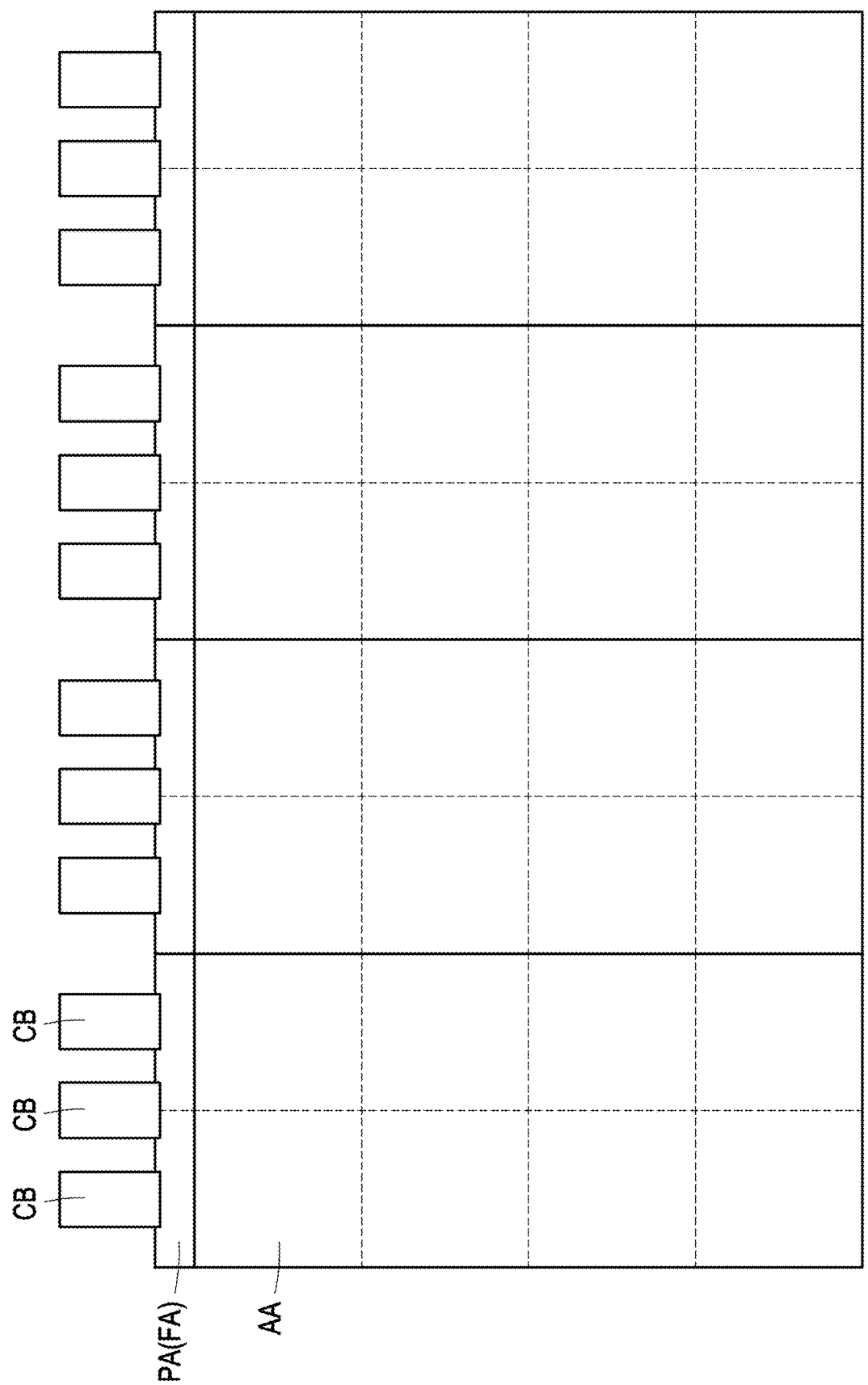
FIG. 1 is a schematic top view of a tiled electronic device of an embodiment of the disclosure.

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the number and size of each element in the figures are for illustration, and are not intended to limit the scope of the disclosure.

Certain terms are used throughout the specification and the appended claims of the disclosure to refer to particular elements. Those skilled in the art should understand that electronic device manufacturers may refer to the same elements under different names. This article is not intended to distinguish between elements having the same function but different names. In the following description and claims, the words "including", "containing", "having", and the like are open words, so they should be interpreted as meaning "including but not limited to . . . " Therefore, when the terms "including", "containing", and/or "having" are used in the description of the disclosure, they specify the presence of corresponding features, areas, steps, operations, and/or components, but do not exclude the presence of one or more corresponding features, areas, steps, operations, and/or components.

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and location of each film, area, and/or structure may be reduced or enlarged.

When a corresponding component (such as a film or region) is referred to as "on another component", it may be directly on the other component, or there may be other components between the two. Moreover, when a component is referred to as "directly on another component", there is no component between the two. In addition, when a component is referred to as "on another component", the two components have an up-down relationship in the top view, and this component may be above or below the other component, and this up-down relationship depends on the orientation of the device.

The terms "about", "substantially", or "roughly" are generally interpreted as being within 20% of a given value or range, or interpreted as being within 10%, 5%, 3%, 2%, 1%, or 0.5% of a given value or range.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The same terms may not be used in the claims and the specification, and accordingly, the first component in the specification may be the second component in the claims.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

The electrical connections described in the disclosure may all refer to direct connection or indirect connection. In the case of direct connection, the endpoints of elements on two circuits are directly connected or connected to each other by a conductor line segment.

In the present disclosure, the thickness, length, and width may be measured using an optical microscope, and the thickness may be measured from a cross-sectional image in an electron microscope, but the disclosure is not limited thereto. In addition, there may be a certain error in any two values or directions for comparison. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

The electronic device of the disclosure may include, but is not limited to, a display equipment, an antenna device, a sensing device, a tiling device, a touch device, or a combination thereof. The electronic device includes, but is not limited to, a rollable, bendable, or flexible electronic device. The electronic device may include, for example, a liquid crystal, a light-emitting diode (LED), a quantum dot (QD), fluorescence, phosphor, other suitable materials, or a combination of the above. The LED may include, for example, an organic LED (OLED), a micro LED, a mini LED, a QLED, or a QDLED, but the disclosure is not limited thereto. The display equipment may be a self-luminous display equipment. The antenna device may be a liquid-crystal type antenna device or a non-liquid-crystal type antenna device, and the sensing device may be a sensing device sensing capacitance, light, heat, or ultrasound, but the disclosure is not limited thereto. The sensing device may include, but not limited to, a fingerprint sensing device, a visible light sensing device, an infrared light sensing device, or an X-ray sensing device. The tiling device may be, for example, a display tiling device or an antenna tiling device, but the disclosure is not limited thereto. It should be noted that the electronic device may be any combination of the foregoing, but the disclosure is not limited thereto. In addition, the appearance of the electronic device may be rectangular, circular, polygonal, a shape with a curved edge, or other suitable shapes. The electronic device may have a peripheral system such as a processing system, a driving system, a control system, a light source system, a shelf system, etc., to support a display equipment or a tiling device. It should be noted that the electronic device may be any combination of the foregoing, but the disclosure is not limited thereto. The following uses a display device or a tiling device as an electronic device to explain the content of the disclosure, but the disclosure is not limited thereto.

The following exemplifies the exemplary embodiments of the disclosure. The same reference numerals are used in the drawings and description to represent the same or similar parts.

Figure 2A:
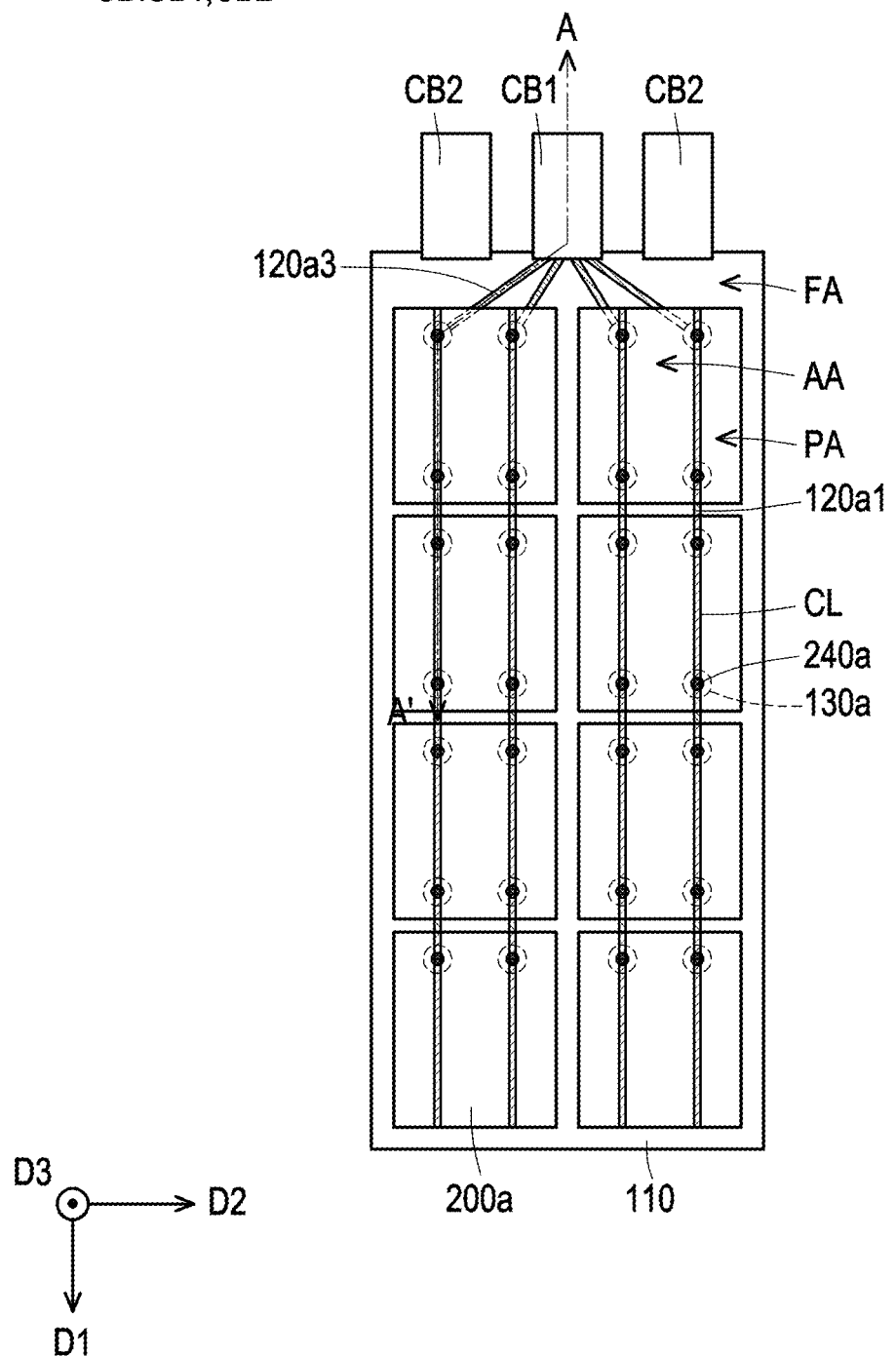
FIG. 2A is a schematic top view of the electronic device of the first embodiment of the disclosure.
Figure 2B:
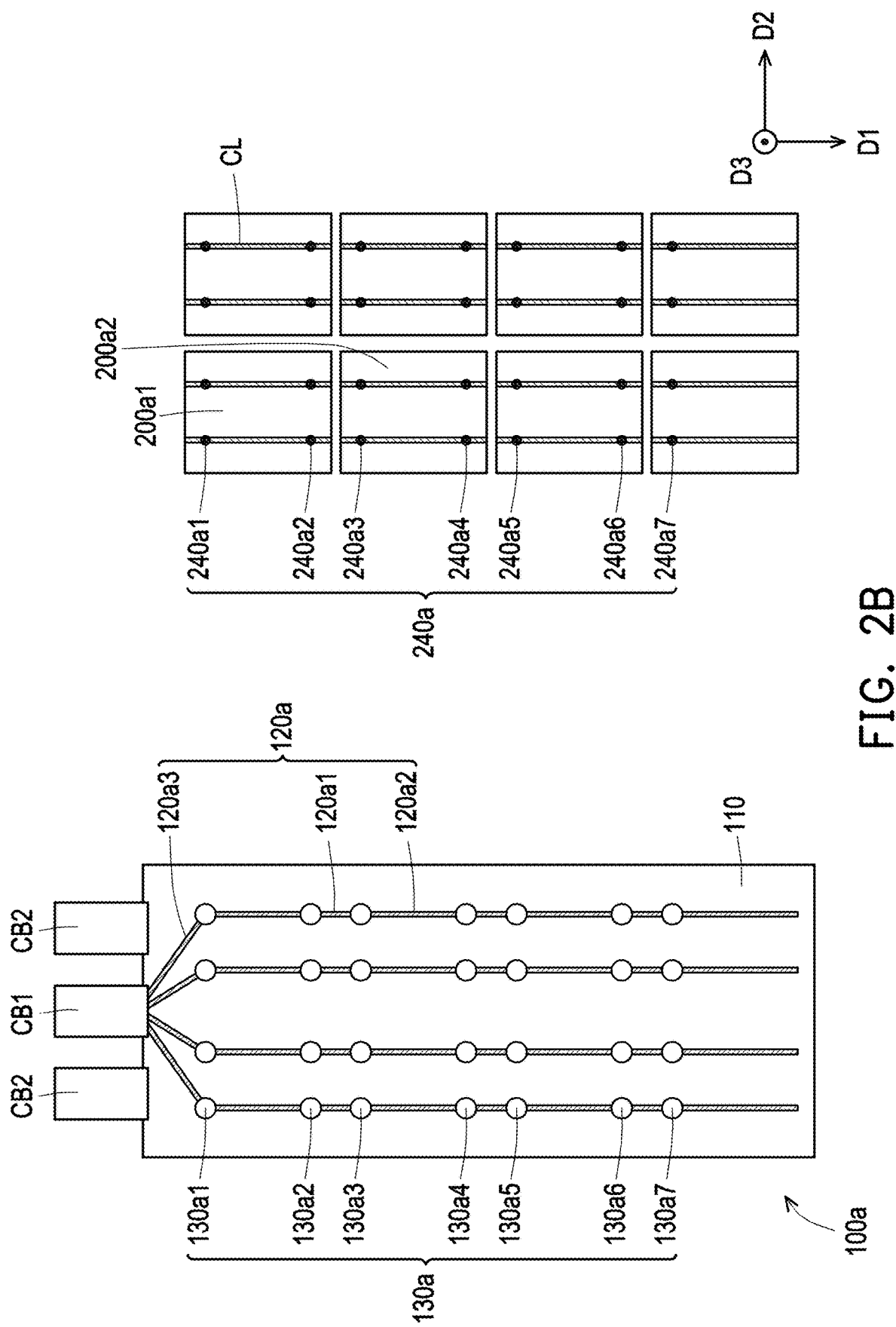
FIG. 2B is an exploded view according to an embodiment of FIG. 2A.
Figure 2C:
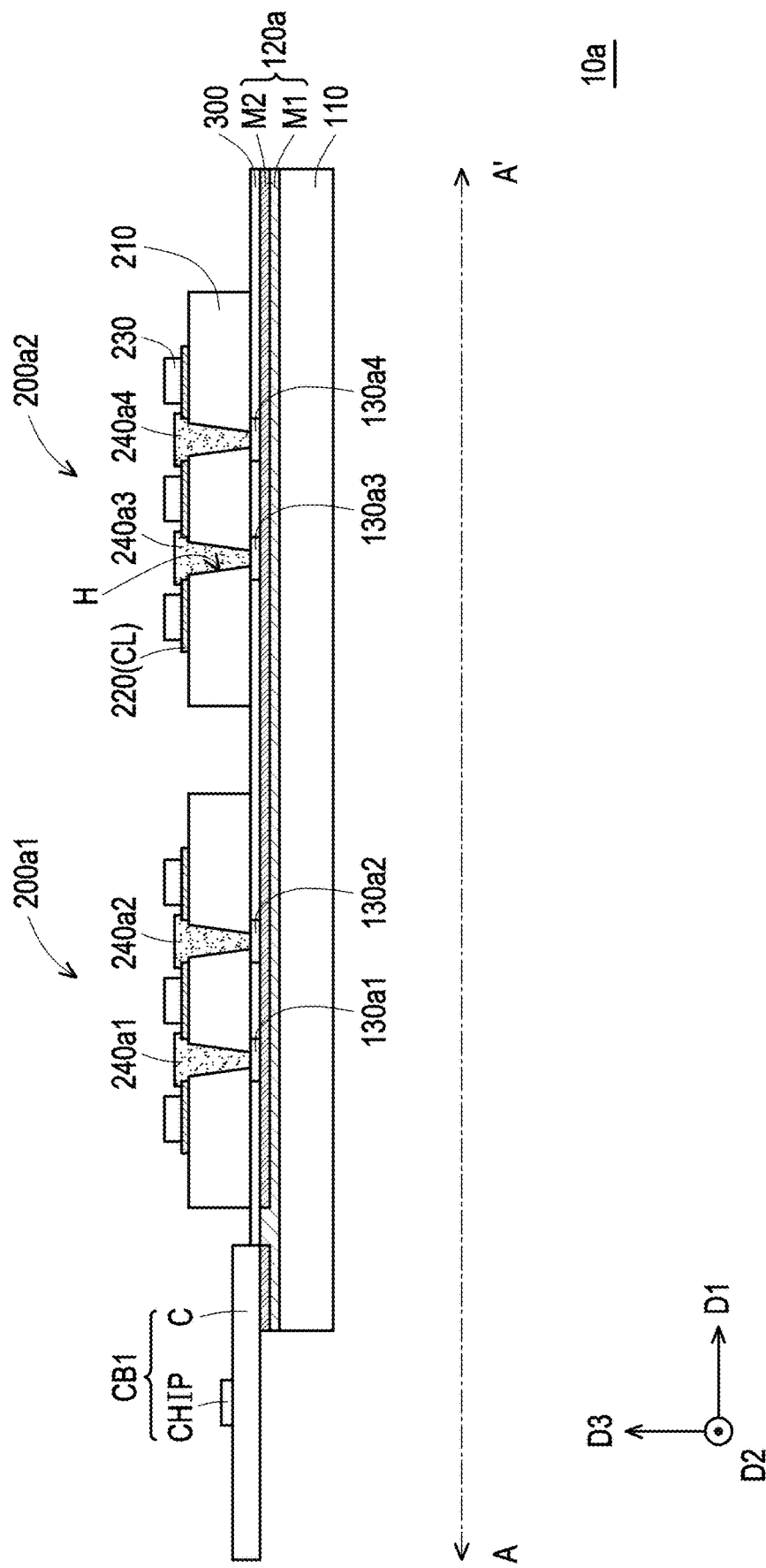
FIG. 2C is a partial cross-sectional schematic diagram of an embodiment according to section line A-A' of FIG. 2B.

FIG. 1 is a schematic top view of a tiled electronic device of an embodiment of the disclosure, FIG. 2A is a schematic top view of the electronic device of the first embodiment of the disclosure, FIG. 2B is an exploded view according to an embodiment of FIG. 2A, and FIG. 2C is a partial cross-sectional schematic diagram of an embodiment according to section line A-A' of FIG. 2B. It should be mentioned that, for clarity of the drawings and convenience of description, several elements are omitted in FIG. 1.

Referring to FIG. 1, a tiling electronic device 1 of the present embodiment includes a plurality of electronic devices 10 tiled together, wherein each of the electronic devices 10 includes an active area AA and a peripheral area PA including a fan-out area FA, and the peripheral area PA is located on at least one side of the active area AA, and the fan-out area FA may be located on one side of the active area AA, but the disclosure is not limited thereto. In some embodiments, a plurality of panels (not shown) are disposed in the active area AA and electrically connected to each other, and the circuit board CB is disposed in the fan-out area FA. The technical solutions for the panel and the circuit board CB will be described in detail in the following embodiments.

Please refer to FIG. 2A, FIG. 2B, and FIG. 2C at the same time, an electronic device 10a of the present embodiment includes a support plate 100a, a plurality of panels 200a, and a circuit board CB.

In some embodiments, the support plate 100a includes a support substrate 110, a plurality of connecting lines 120a, and a plurality of bridge members 130a. The material of the support substrate 110 may be, for example, plastic, glass, or a combination thereof. For example, the material of the support substrate 110 may include polyimide (PI), polymethyl methacrylate (PMMA), polycarbonate (PC), polyethylene terephthalate (PET), quartz, sapphire, other suitable materials, or a combination of the above materials, but the disclosure is not limited thereto. The plurality of connecting lines 120a may be disposed on the support substrate 110. In some embodiments, each of the plurality of connecting lines 120a is electrically connected to a first circuit board CB1 in the circuit board CB. Specifically, each of the connecting lines 120a may be connected to the first circuit board CB1 in the fan-out area FA, may be extended from the fan-out area FA to the active area AA, and may be extended along a first direction D1 in the active area AA. The plurality of bridge members 130a may be disposed on the support substrate 110. In some embodiments, one of the plurality of bridge members 130a may be electrically connected to the corresponding connecting line 120a. Moreover, for example, the plurality of bridge members 130a may be disposed on each of the connecting lines 120a along the first direction D1 and spaced apart from each other, so that the connecting lines 120a are electrically connected to the corresponding panels 200a subsequently, but the disclosure is not limited thereto. In some embodiments, the width of the connecting lines 120a in a second direction D2 may be greater than or equal to 25 μm and less than or equal to 55 μm (25 μm≤width≤55 μm), so as to have a lower resistance value. For example, the width of the connecting lines 120a in the second direction D2 may be 30 μm 40 μm or 50 μm but the disclosure is not limited thereto. The material of the connecting lines 120a may, for example, include copper, molybdenum, aluminum, or a combination thereof. In the present embodiment, the material of the connecting lines 120a is a double metal layer formed by a molybdenum layer and a copper layer, but the disclosure is not limited thereto. When the material of the connecting lines 120a is a double metal layer formed by a molybdenum layer and a copper layer, the thickness of the molybdenum layer in a third direction D3 (the normal direction of the support substrate 110) may be greater than or equal to 80 angstroms and less than or equal to 150 angstroms (80 Å≤thickness≤150 Å), and the thickness of the copper layer on the third direction D3 may be greater than or equal to 10000 angstroms and less than or equal to 15000 angstroms (10000 Å≤thickness≤15000 Å), so as to have a lower resistance value. For example, the thickness of the molybdenum layer in the third direction D3 may be 100 angstroms, 110 angstroms, 120 angstroms, 130 angstroms, and the thickness of the copper layer in the third direction D3 is 12000 angstroms, 13000 angstroms, 14000 angstroms, but the disclosure is not limited thereto. In some embodiments, the plurality of connecting lines 120a may include a single-layer structure or a multi-layer structure. In the present embodiment, the plurality of connecting lines 120a include a two-layer structure formed by a metal layer M1 (which may be, for example, the double-layer metal layer above) and a metal layer M2 (which may be, for example, the double-layer metal layer above), but the disclosure is not limited thereto.

In some embodiments, one of the plurality of connecting lines 120a includes connecting lines 120a1, wherein the connecting lines 120a1 are located between corresponding adjacent bridge members 130a, and a portion of the connecting lines 120a1 are exposed by the plurality of panels 200a. Specifically, in the present embodiment, the connecting lines 120a1 are located between bridge members 130a2 and bridge members 130a3, between bridge members 130a4 and bridge members 130a5, and between bridge members 130a6 and bridge members 130a7, and at least partially exposed by the adjacent panel 200a. Moreover, in the present embodiment, one of the plurality of connecting lines 120a further includes connecting lines 120a2, wherein the connecting lines 120a2 are located between corresponding adjacent bridge members 130a, and the connecting lines 120a2 are covered by one of the plurality of panels 200a. In the present embodiment, the connecting lines 120a2 are located between the bridge members 130a1 and the bridge members 130a2, between the bridge members 130a3 and the bridge members 130a4, and between the bridge members 130a5 and the bridge members 130a6, and are covered by each of the panels 200a. In addition, the connecting lines 120a1 are, for example, located between and connected to two connecting lines 120a2 to form the connecting lines 120a extended along the first direction D1. However, the disclosure is not limited thereto, and in some other embodiments, one of the plurality of connecting lines 120a may not include the connecting lines 120a2, but form a plurality of connecting lines broken in the first direction D1. Moreover, one of the plurality of connecting lines 120a includes, for example, connecting lines 120a3, wherein the connecting lines 120a3 are located between the bridge members 130a and the circuit board CB, for example, and are connected to the corresponding connecting lines 120a1.

In some embodiments, the distance between adjacent bridge members 130a may be greater than or equal to 2 mm and less than or equal to 30 mm. For example, the distance between adjacent bridge members 130a may be 2.5 mm, 5 mm, 10 mm, 15 mm, 20 mm, 25 mm, or 28 mm, but the disclosure is not limited thereto.

From another perspective, in some embodiments, the support plate 100a in the electronic device 10a includes the bridge members 130a1 (first bridge members) and the bridge members 130a2 (second bridge members). Moreover, in some embodiments, the support plate 100a further includes the connecting lines 120a2 (second connecting lines), wherein the connecting lines 120a2 (second connecting lines) are connected to the bridge members 130a1 (first bridge members) and the bridge members 130a2 (second bridge members). In the present embodiment, the connecting lines 120a2 (second connecting lines) may include a multi-layer metal structure, but the disclosure is not limited thereto. Moreover, in the present embodiment, the distance between the bridge members 130a1 (first bridge members) and the bridge members 130a2 (second bridge members) is greater than or equal to 2 mm and less than or equal to 30 mm.

The plurality of panels 200a are, for example, disposed on the support plate 100a and separated from each other. In some embodiments, the panels 200a may be display panels, but the disclosure is not limited thereto. It should be noted here that although FIG. 2A shows an arrangement of eight panels 200a, the disclosure is not limited thereto, that is, the panels may be of other quantities. In addition, the plurality of panels 200a may be disposed on the support substrate 100 in an array, staggered arrangement (e.g., pentile manner), or other manners, for example, but the disclosure is not limited thereto. For example, the plurality of panels 200a may be arranged in the first direction D1 and/or the second direction D2, wherein the first direction D1 and the second direction D2 are substantially perpendicular. In the present embodiment, the plurality of panels 200a are arranged in an array, four panels 200a are arranged in the first direction D1, and two panels 200a are arranged in the second direction D2 to form a 4×2 panel array, but the disclosure is not limited thereto. From another perspective, the four panels 200a arranged in the first direction D1 may, for example, each form two groups of panels, wherein the two groups of panels are arranged along the second direction D2. It should be noted that, although the embodiment shows that the shape of the panels 200a is a rectangle, the disclosure is not limited thereto. That is, in other embodiments, the shape of the panels 200a may include a circle, a polygon, an arc, or other suitable shapes, but the disclosure is not limited thereto.

In some embodiments, each of the panels 200a includes a substrate 210, an element layer 220, a plurality of light-emitting elements 230, and a plurality of bridge members 240a, but the disclosure is not limited thereto. In some embodiments, the material of the substrate 210 may include polyimide, polymethyl methacrylate, polycarbonate, polyethylene terephthalate, quartz, sapphire, or other suitable materials or a combination thereof, but the disclosure is not limited thereto. The element layer 220 is disposed on the substrate 210, for example. In some embodiments, the element layer 220 includes a circuit structure for driving the plurality of light-emitting elements 230. For example, the element layer 220 may include a plurality of signal lines CL, a plurality of transistors (not shown), and/or a plurality of electrodes (not shown), but the disclosure is not limited thereto. The plurality of signal lines CL may, for example, include a plurality of data lines, a plurality of scan lines (not shown), and/or other signal lines (such as power supply lines, working signal lines, etc.) suitable for the panels 200a, wherein the signal lines CL shown in FIG. 2A and FIG. 2B are data lines, but the disclosure is not limited thereto. Each of the plurality of signal lines CL may respectively be extended along the first direction D1. In some embodiments, the plurality of light-emitting elements 230 are disposed on the element layer 220, for example, the plurality of light-emitting elements 230 may be disposed on the element layer 220 in an array arrangement, staggered arrangement (for example, in a pentile manner), or other manners, but the disclosure is not limited thereto. In some embodiments, the plurality of light-emitting elements 230 may be electrically connected to the element layer 220 via a conductive pad (not shown), but the disclosure is not limited thereto. In some embodiments, the plurality of light-emitting elements 230 may include self-luminous materials. For example, each of the plurality of light-emitting elements 230 may include an organic light-emitting diode (OLED), an inorganic LED, such as a mini LED or a micro LED, a quantum dot (QD), a QLED or QDLED, fluorescence, phosphor, other suitable materials or a combination of the above materials, but the disclosure is not limited thereto, and the size of the light-emitting elements 230 may be modulated according to requirements. In other embodiments, the light-emitting elements 230 may include non-self-luminous materials, such as: liquid-crystal molecules, electrophoretic display media, or other applicable media are examples. The liquid-crystal molecules are liquid-crystal molecules that may be rotated or switched by a vertical electric field or liquid-crystal molecules that may be rotated or switched by a lateral electric field, but the disclosure is not limited thereto. In some embodiments, the plurality of bridge members 240a may penetrate through the substrate 210 and be electrically connected to the element layer 220. In detail, each of the plurality of bridge members 240a may be disposed between a portion of adjacent light-emitting elements 230 and located in a contact hole H penetrating through the substrate 210, for example. In some embodiments, one of the plurality of bridge members 240a may be electrically connected to the corresponding bridge member 130a and the corresponding signal line CL. In the present embodiment, the plurality of bridge members 240a may each correspond to the plurality of bridge members 130a disposed on the support substrate 110. Specifically, the corresponding bridge members 130a may be, for example, overlapped and connected to each other in the third direction with the corresponding bridge members 240a. Therefore, the bridge members 240a may be electrically connected to the corresponding bridge members 130a, so that each of the panels 200a may be electrically connected to the first circuit board CB1 via the corresponding connecting line 120a to receive a signal from the first circuit board CB1.

Since the plurality of bridge members 240a on the panels 200a may each correspond to the plurality of bridge members 130a disposed on the support substrate 110, in some embodiments, the distance between adjacent bridge members 240a may be greater than or equal to 2 mm and less than or equal to 30 mm. For example, the distance between adjacent bridge members 240a may be 2.5 mm, 5 mm, 10 mm, 15 mm, 20 mm, 25 mm, or 28 mm, but the disclosure is not limited thereto.

From another perspective, in some embodiments, the electronic device 10a includes a panel 200a1 (first panel). The panel 200a1 (first panel) is disposed on the support plate 100a, and includes the substrate 210, the signal lines CL, bridge members 240a1 (third bridge members), and bridge members 240a2 (fourth bridge members), wherein the bridge members 240a1 (third bridge members) and the bridge members 240a2 (fourth bridge members) correspond to the bridge members 130a1 (first bridge members) and the bridge members 130a2 (second bridge members), respectively. The signal lines CL are disposed on the substrate 210, for example. The bridge members 240a1 (third bridge members), for example, penetrate through the substrate 210 and are electrically connected to the signal lines CL and the bridge members 130a1 (first bridge members). The bridge members 240a2 (fourth bridge members), for example, penetrate through the substrate 210 and are electrically connected to the signal lines CL and the bridge members 130a2 (second bridge members). In some embodiments, the electronic device 10a further includes a panel 200a2 (second panel) and the bridge members 130a3 (fifth bridge members), wherein the support plate 100a further includes the connecting lines 120a1 (first connecting lines), the connecting lines 120a1 (first connecting lines) are connected to the bridge members 130a2 (second bridge members) and the bridge members 130a3 (fifth bridge members), and the panel 200a1 (first panel) and the panel 200a2 (second panel) are electrically connected via the connecting lines 120a1 (first connecting lines). In some embodiments, a portion of the connecting lines 120a1 (first connecting lines) is exposed by the panel 200a1 (first panel) and the panel 200a2 (second panel), and the connecting lines 120a2 (second connecting lines) are covered by one of the panel 200a1 (first panel) and the panel 200a2 (second panel). Moreover, in the present embodiment, the distance between the bridge members 240a1 (third bridge members) and the bridge members 240a2 (fourth bridge members) is greater than or equal to 2 mm and less than or equal to 30 mm.

Accordingly, the first circuit board CB1 may transmit a signal to each of the panels 200a via the connecting lines 120a, so that the panels 200a may perform actions (e.g., display) according to the received signal. Moreover, in some embodiments, the signal line CL extended along the first direction D1 may be at least partially overlapped with the connecting lines 120a disposed on the support substrate 110, but the disclosure is not limited thereto.

It should be mentioned that, although two bridge members 240a electrically connected to one signal line CL are shown in the present embodiment, the disclosure is not limited to. That is, in other embodiments, the number of the plurality of bridge members 240a electrically connected to one signal line CL may be more than two. Moreover, although the present embodiment shows that one panel 200a includes two signal lines CL, those skilled in the art should understand that each of the panels 200a may include more than two signal lines CL.

In some embodiments, the panels 200a of the present embodiment may optionally include a filling layer (not shown). For example, the filling layer is disposed on the element layer 220 and covers the light-emitting elements 230. For example, in addition to being disposed above the light-emitting elements 230, the filling layer is also disposed adjacent to or surrounding the light-emitting elements 230. Therefore, the filling layer may be used, for example, to fix or protect the light-emitting elements 230. In some embodiments, the filling layer includes a transparent material. For example, the material of the filling layer may include epoxy resin, acrylic, other suitable materials, or a combination thereof. In some embodiments, the filling layer may include a single-layer structure or a composite-layer structure, but the disclosure is not limited thereto. In addition, the panels 200a of the present embodiment may, for example, optionally further include a functional layer (not shown), wherein the functional layer, for example, covers the filling layer. In some embodiments, the functional layer may, for example, have a high surface hardness. For example, the functional layer may include, for example, a hard coat layer with a pencil hardness greater than 5H, so as to protect members such as the light-emitting elements 230 from being scratched or damaged. In addition, the functional layer may also have a function such as anti-glare or reducing chromatic aberration. For example, the functional layer may include a plurality of anti-glare structures or optical matching layers, for example. The anti-glare structures can, for example, be configured to sufficiently scatter the incident ambient light, so as to reduce most of the ambient light incident to the panels 200a affecting the display effect of the panels 200a, thereby having anti-glare capability. Moreover, the optical matching layer may, for example, include a plurality of film layers having different refractive indices, which may be used to alleviate the issue that members such as the light-emitting elements 230 interfere with the display of the panels 200a under the illumination of ambient light.

In the present embodiment, an insulating layer 300 may be further disposed between each of the panels 200a and the support plate 100a, but the disclosure is not limited thereto. For example, the insulating layer 300 covers the connecting lines 120a on the support plate 100a but exposes at least a portion of the bridge members 130a, so that the bridge members 130a and the bridge members 240a may be electrically connected.

The circuit board CB is, for example, disposed on the support board 100a and configured to provide a signal to the signal lines CL. In some embodiments, the circuit board CB is disposed on the support substrate 110 of the support plate 100a, and may be disposed on at least one side of the support plate 100a. In the present embodiment, the circuit board CB is disposed in the fan-out area FA on one side of the support plate 100a. The circuit board CB may be electrically connected to the plurality of connecting lines 120a disposed on the support substrate 110, so as to be electrically connected to each of the panels 200a, for example, via the connecting lines 120a, the bridge members 130a, and the bridge members 240a. Thereby, the plurality of panels 200a may perform corresponding actions. For example, the circuit board CB may be a printed circuit board (PCB), a flexible printed circuit board (FPC), a chip on film (COF), or other suitable circuit boards, but the disclosure is not limited thereto. Taking the first circuit board CB1 in the circuit board CB as an example, the first circuit board CB1 may include a driving chip CHIP, a substrate C, or a combination thereof. In some embodiments, the driving chip CHIP may include a driving unit such as a timing control unit, a data driving unit, and a power driving unit, and the material of the substrate C may include polyimide (PI), polyethylene terephthalate (PET), epoxy resin, or glass fiber plate, but the disclosure is not limited thereto. That is, in other embodiments, the plurality of panels 200a may be controlled via a second circuit board CB2. In some embodiments, two second circuit boards CB2 may be provided, wherein, for example, each of the two second circuit boards CB2 is configured to control the panel groups arranged along the second direction D2. The second circuit board CB2 may include, for example, a flexible printed circuit board, but the disclosure is not limited thereto.

Based on the above, by making the support plate 100a include the plurality of connecting lines 120a extended along the first direction D1; and each of the panels 200a is provided with the plurality of bridge members 240a corresponding to the bridge members 130a, in a subsequent process or during use of the electronic device 10a of the present embodiment, when a portion of the connecting lines 120a is broken due to reasons such as bending of the electronic device 10 a or a portion of the bridge members 130a and/or the bridge members 240a is defective and may not be electrically connected, the failure of the electronic device 10a due to inability to transmit signals may be reduced. For example, taking FIG. 2A and FIG. 2B as an example, if the connecting lines 120a2 located between the bridge members 130a1 and the bridge members 130a2 are broken, the signal transmission between the adjacent panel 200a1 and panel 200a2 may still be implemented, for example, via the following path: the circuit board CB1→the connecting lines 120a3→the bridge members 130a1→the bridge members 240a1→the signal lines CL→the bridge members 240a2→the bridge members 130a2→the connecting lines 120a1→the bridge members 130a3→the bridge members 240a3, wherein the bridge members 130a1, the bridge members 130a2, and the bridge members 130a3 correspond to the bridge members 240a1, the bridge members 240a2, and the bridge members 240a3 respectively, and the bridge members 240a1 and the bridge members 240a2 are located in the same panel 200a1, and the bridge members 240a3 are located in the panel 200a2. Moreover, if the bridge members 130a5 located between the bridge members 130a4 and the bridge members 130a6 and/or the bridge members 240a5 located between the bridge members 240a4 and the bridge members 240a6 are damaged, the signal transmission from the circuit board CB1 to a panel 200a3 may still be implemented, for example, via the following path (taking the damage of the bridge members 130a5 as an example): the circuit board CB1→the connecting lines 120a (including the connecting lines 120a3 and the plurality of connecting lines 120a1 and 120a2)→the bridge members 130a4→the connecting lines 120a1→the connecting lines 120a2→the bridge members 130a6→the bridge members 240a6, wherein the bridge members 130a4, the bridge members 130a5, the bridge members 130a6, and the bridge members 130a7 correspond to the bridge members 240a4, the bridge members 240a5, the bridge members 240a6, and the bridge members 240a7, respectively.

Figure 3A:
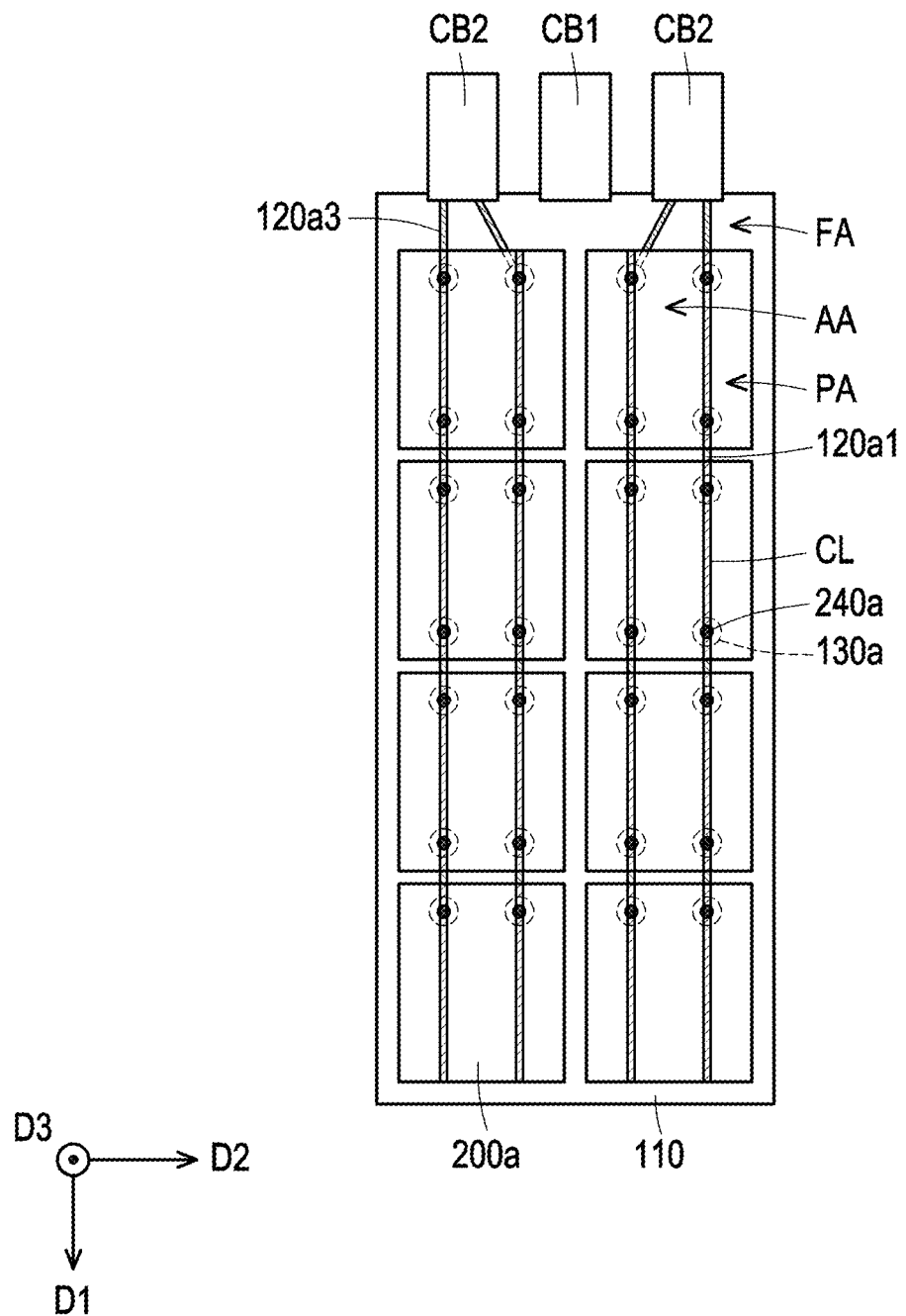
FIG. 3A is a schematic top view of the electronic device of the second embodiment of the disclosure.
Figure 3B:
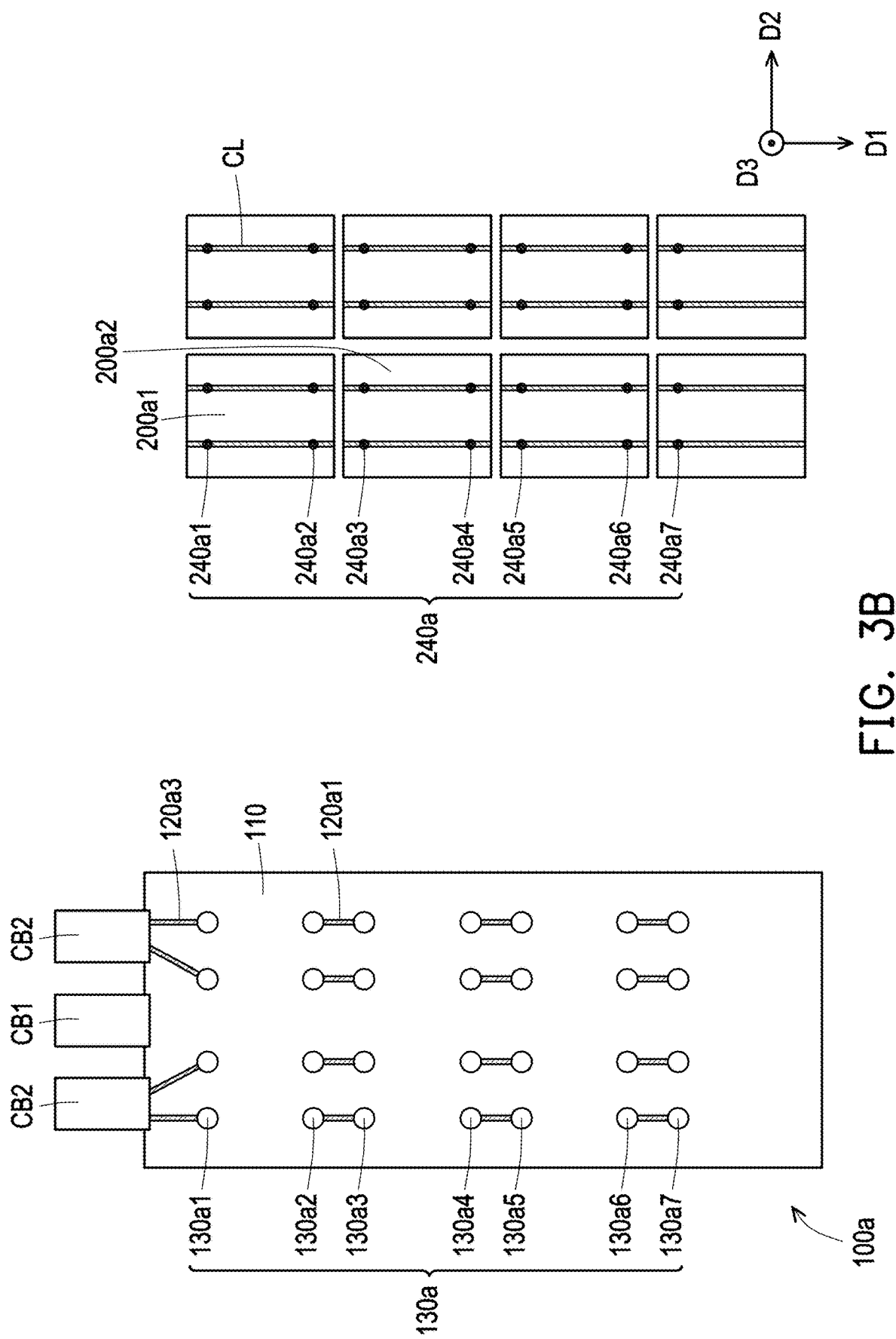
FIG. 3B is an exploded view according to FIG. 2A.

FIG. 3A is a schematic top view of an electronic device of the second embodiment of the disclosure, and FIG. 3B is an exploded view according to FIG. 2A. It should be noted that, the embodiment of FIG. 3A and FIG. 3B may respectively adopt the reference numerals and part of the content of the embodiment of FIG. 2A and FIG. 2B. The same or similar reference numerals are used to indicate the same or similar components, and the description of the same technical content is omitted.

Referring to FIG. 3A and FIG. 3B at the same time, the main difference between an electronic device 10b of the present embodiment and the electronic device 10a is: the electronic device 10b does not include the connecting lines 120a2, that is, the connecting lines 120a (the connecting lines 120a1) are disposed spaced apart from each other in the first direction D1. In addition, in the present embodiment, the plurality of panels 200a are controlled by the second circuit board CB2, but the disclosure is not limited thereto. In the present embodiment, the signal transmission between the adjacent panel 200a1 and panel 200a2 may be implemented, for example, via the following path: the circuit board CB2→the connecting lines 120a3→the bridge members 130a1→the bridge members 240a1→the signal lines CL→the bridge members 240a2→the bridge members 130a2→the connecting lines 120a1→the bridge members 130a3→the bridge members 240a3. Accordingly, the electronic device 10b of the present embodiment may reduce the installation cost of the connecting lines 120a.

Figure 4:
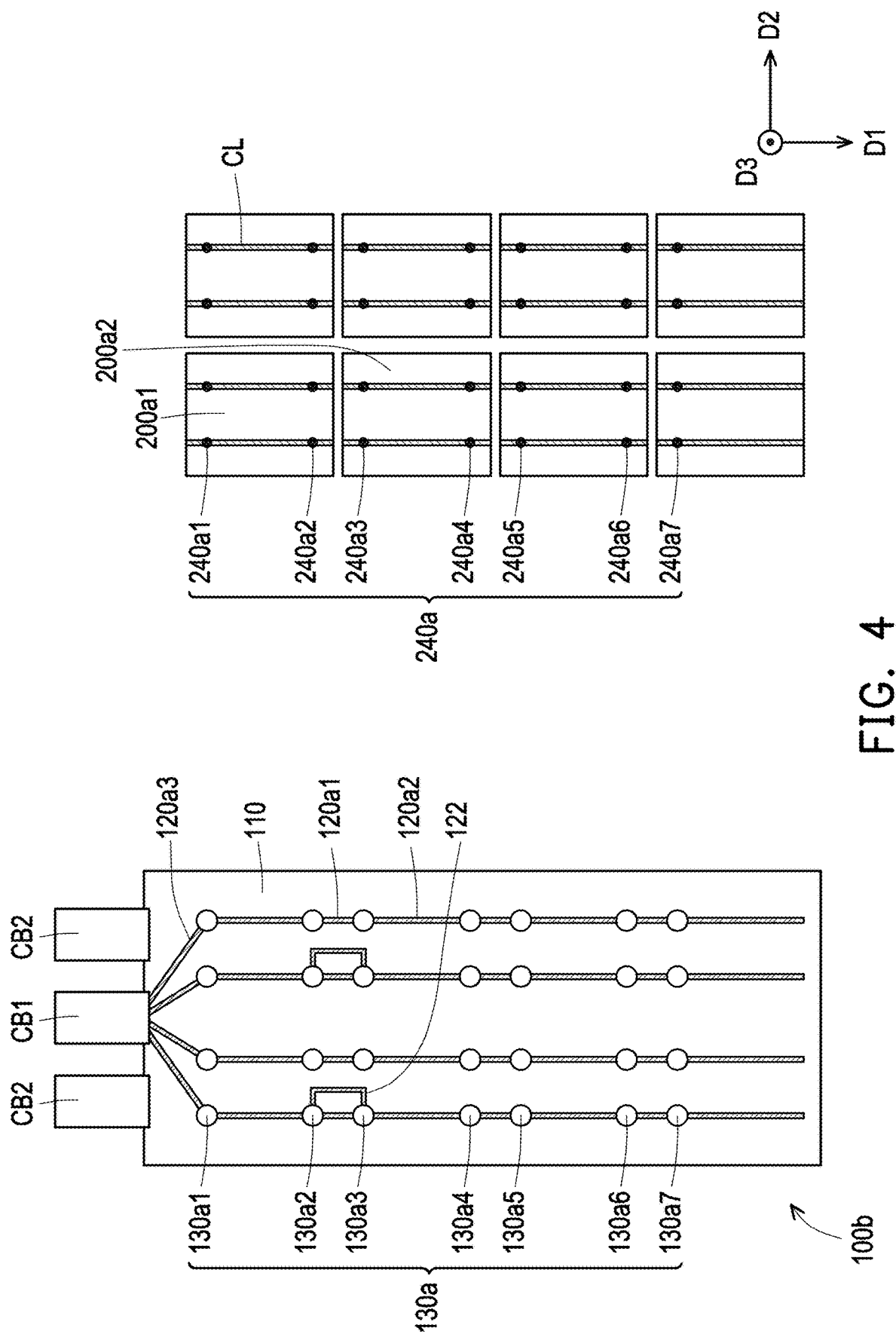
FIG. 4 is an exploded view according to another embodiment of FIG. 2A.

FIG. 4 is an exploded view according to another embodiment of FIG. 2A. It should be noted that, the embodiment of FIG. 4 may adopt the reference numerals and part of the content of the embodiment of FIG. 2B. The same or similar reference numerals are used to indicate the same or similar components, and the description of the same technical content is omitted.

Please refer to FIG. 2A and FIG. 4 at the same time. The main difference between a support plate 100b of the present embodiment and the support plate 100a is that the support plate 100b further includes at least one redundancy connecting line 122. In some embodiments, each of the redundancy connecting lines 122 is connected to a portion of the adjacent bridge members 130a, but is not connected to another portion of the adjacent bridge members 130a. Specifically, in the present embodiment, a portion of the adjacent bridge members 130a may be connected to the connecting lines 120a and the redundancy connecting lines 122 at the same time, wherein the redundancy connecting lines 122 are not overlapped with the connecting lines 120a in the normal direction (the third direction D3) of the support substrate 110. For example, the redundancy connecting lines 122 may be further disposed between the bridge members 130a2 and the bridge members 130a3, for example, and the redundancy connecting lines 122 are not overlapped with the connecting lines 120a (the connecting lines 120a1) between the bridge members 130a2 and the bridge members 130a3 in the normal direction of the support substrate 110. If the connecting lines 120a1 located between the bridge members 130a2 and the bridge members 130a3 are broken, at least signal transmission may still be implemented via the redundancy connecting lines 122 to reduce the failure of the electronic device 10a due to inability to transmit signals. However, although FIG. 4 shows that the redundancy connecting lines 122 are disposed between the bridge members 130a2 and the bridge members 130a3, the disclosure is not limited thereto. That is, the redundancy connecting lines 122 may also be disposed between other adjacent bridge members 130a.

Viewed from another perspective, in some embodiments, the support plate 100b includes the redundancy connecting lines 122. The redundancy connecting lines 122 may be connected to the bridge members 130a2 (second bridge members) and the bridge members 130a3 (fifth bridge members). In addition, the redundancy connecting lines 122 are not overlapped with the signal lines CL in the third direction D3 (normal direction) of the substrate 210, for example.

Figure 5:
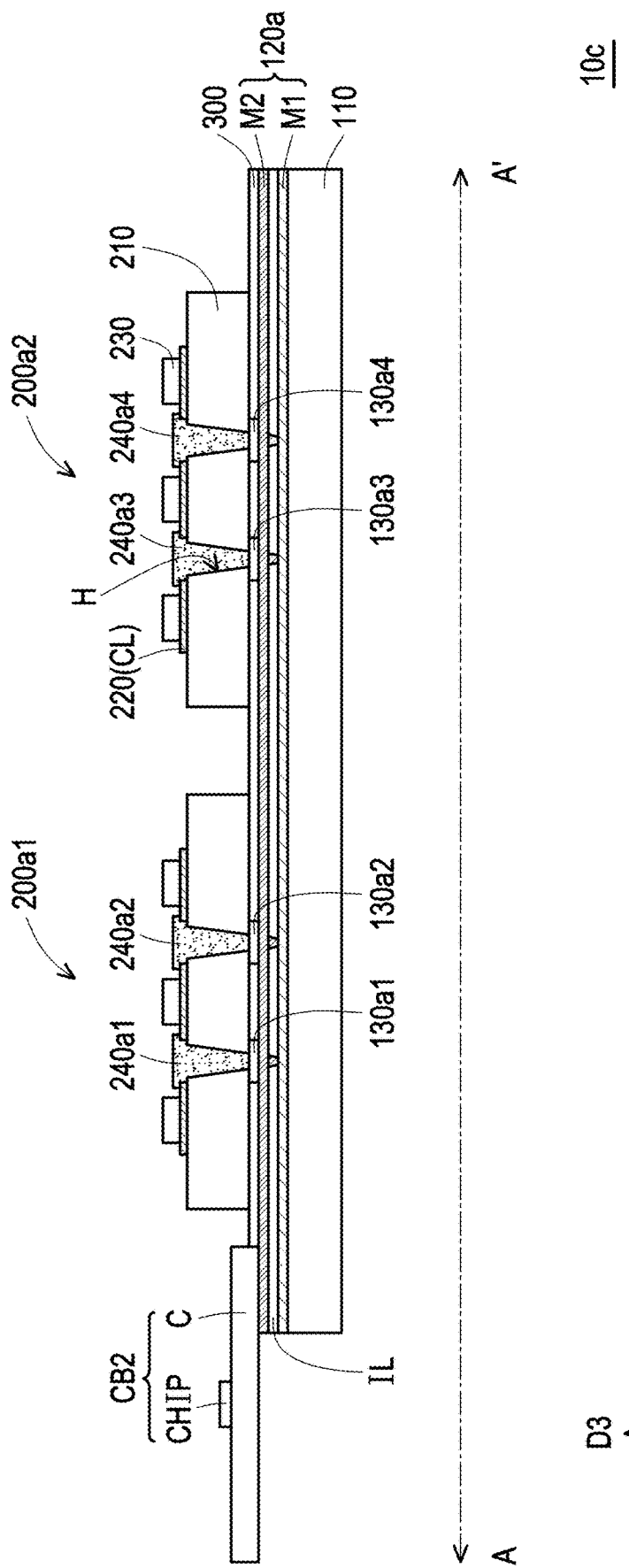
FIG. 5 is a partial cross-sectional schematic diagram of another embodiment according to section line A-A' of FIG. 2B.

FIG. 5 is a partial cross-sectional schematic diagram of another embodiment according to section line A-A' of FIG. 2B. It should be noted that, the embodiment of FIG. 5 may adopt the reference numerals and part of the content of the embodiment of FIG. 2C. The same or similar reference numerals are used to indicate the same or similar components, and the description of the same technical content is omitted.

Referring to FIG. 2A and FIG. 5 at the same time, the main difference between an electronic device 10d of the present embodiment and the electronic device 10a is: the electronic device 10d further includes an insulating layer IL disposed between the metal layer M1 and the metal layer M2 of the connecting lines 120a, a portion of the metal layer M2 is electrically connected to the metal layer M1 through the insulating layer IL, and this design may reduce the chance of failure due to inability to transmit signals. In some other embodiments, the insulating layer IL is between the metal layer M1 and the metal layer M2 and electrically isolates the metal layer M1 and the metal layer M2, the insulating layer IL may be configured to reduce the configuration area of the metal layer M1 and the metal layer M2, and make the metal layer M1 and the metal layer M2 transmit different electrical signals, respectively. For example, the metal layer M1 may be configured to transmit a power signal, and the metal layer M2 may be configured to transmit a data signal, but the disclosure is not limited thereto.

Figure 6A:
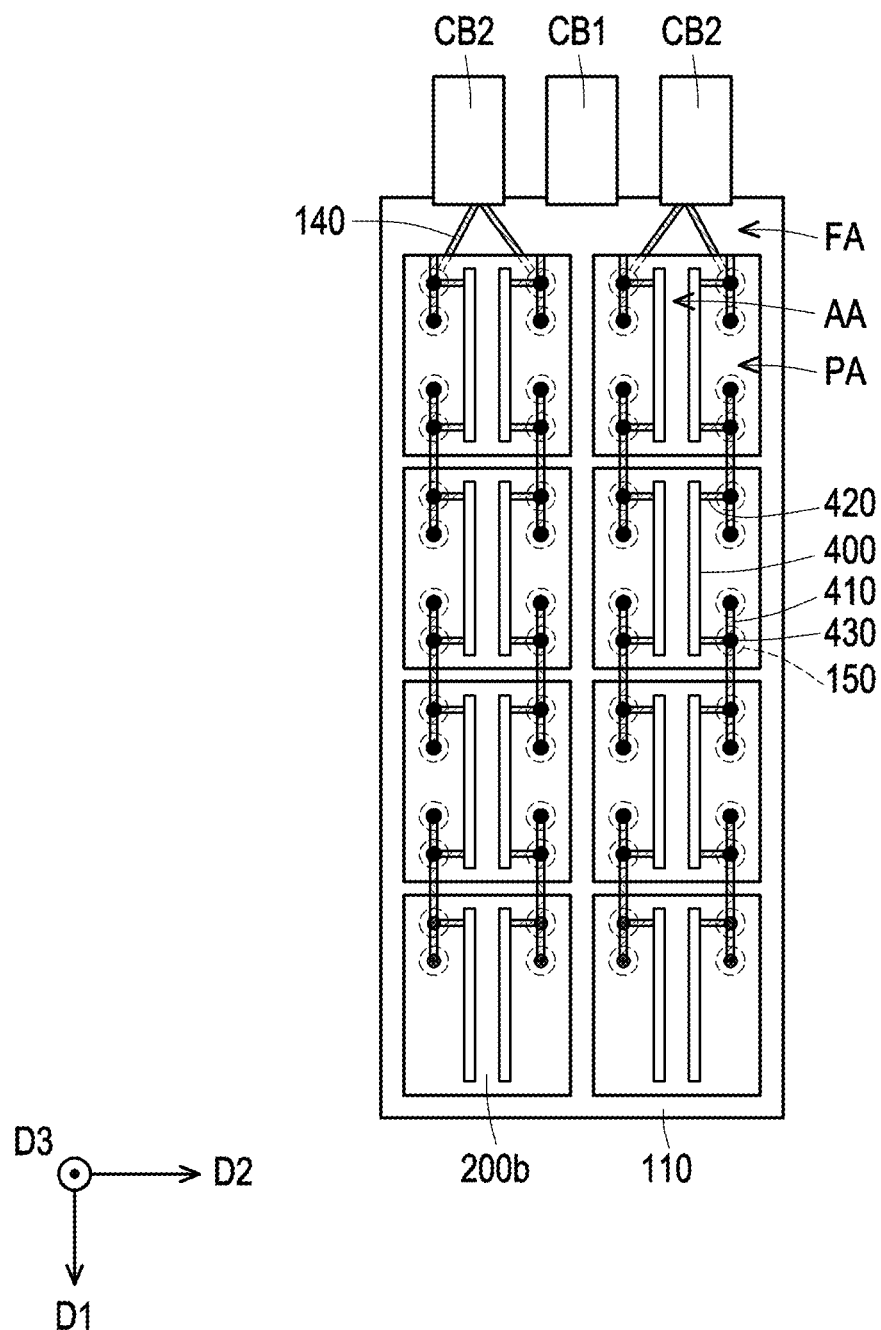
FIG. 6A is a schematic top view of the electronic device of the second embodiment of the disclosure.
Figure 6B:
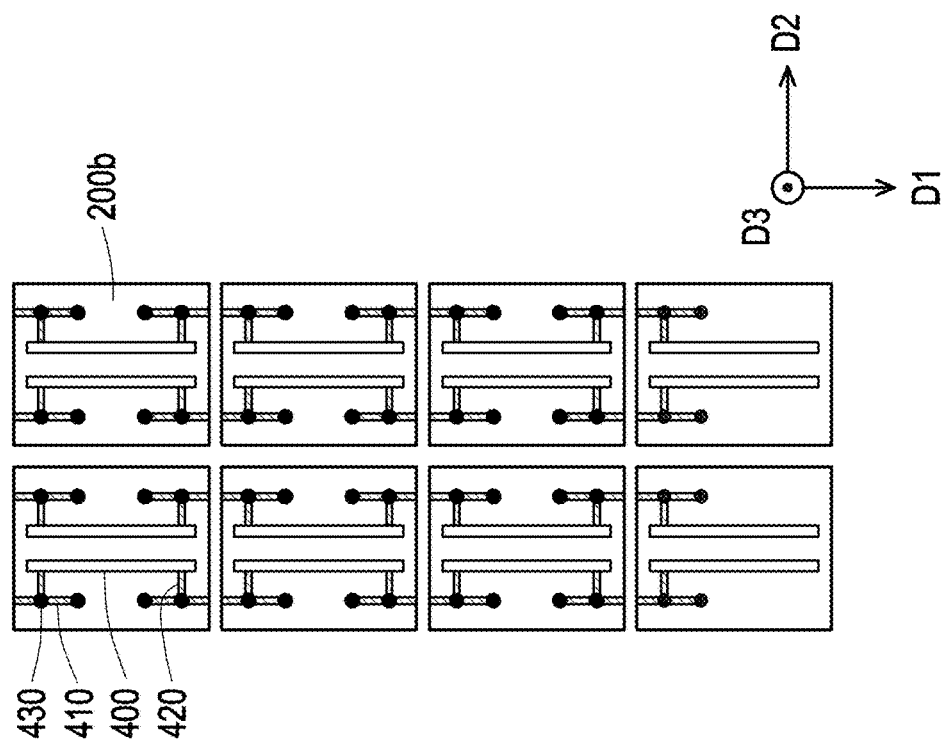
FIG. 6B is an exploded view according to FIG. 6A.
Figure 6B:
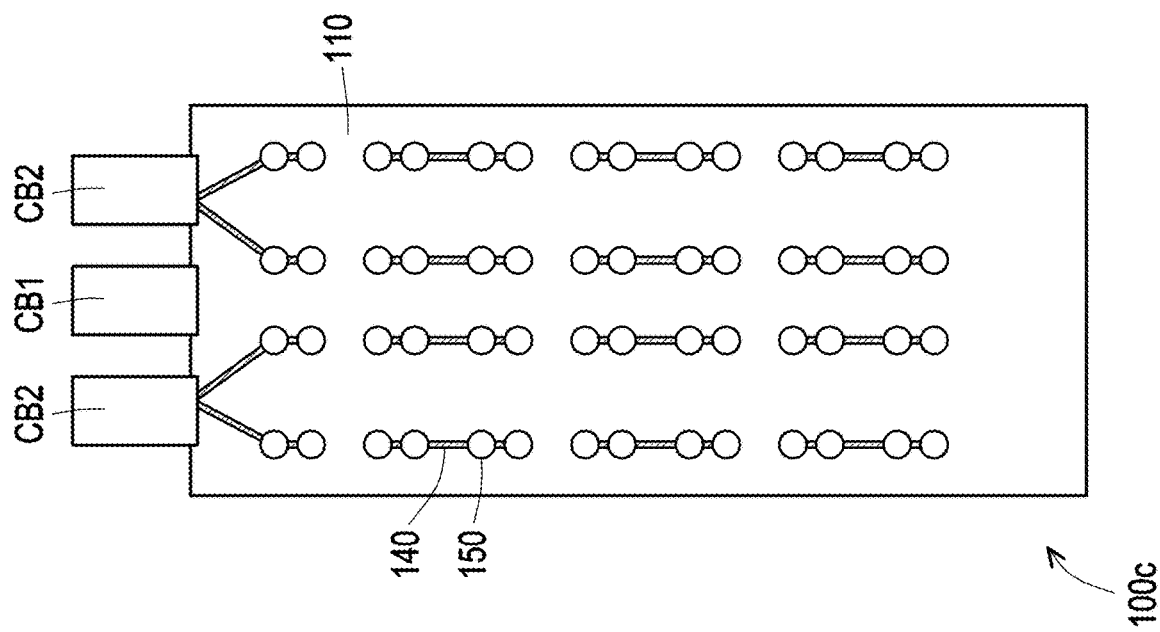

FIG. 6A is a schematic top view of an electronic device of the second embodiment of the disclosure, and FIG. 6B is an exploded view according to FIG. 6A. It should be noted that, the embodiment of FIG. 6A and FIG. 6B may respectively adopt the reference numerals and part of the content of the embodiment of FIG. 2A and FIG. 2B. The same or similar reference numerals are used to indicate the same or similar components, and the description of the same technical content is omitted.

Referring to FIG. 6A and FIG. 6B at the same time, the main difference between an electronic device 20 of the present embodiment and the electronic device 10a is: a support plate 100c of the electronic device 20 further includes a plurality of connecting lines 140 and a plurality of bridge members 150, and a panel 200b of the electronic device 20 further includes a gate driving circuit 400, a working signal line 410, a working connecting line 420, and a plurality of bridge members 430.

In some embodiments, the plurality of connecting lines 140 are located in the peripheral area PA and substantially extended along the first direction D1. In some embodiments, a portion of the connecting lines 140 are electrically connected to the second circuit board CB2 in the circuit board CB, and the plurality of connecting lines 140 are spaced apart from each other in the first direction D1. In detail, a portion of the connecting lines 140 are connected to the second circuit board CB2 in the fan-out area FA, for example, and are disposed at intervals along the first direction D1 in the peripheral area PA. The plurality of bridge members 150 are, for example, disposed on the support substrate 110 and electrically connected to the corresponding connecting lines 140. In some embodiments, the plurality of bridge members 150 may be disposed on each of the connecting lines 140 along the first direction D1 and spaced apart from each other, so that the corresponding connecting line 140 may be configured to electrically connect adjacent panels 200b to each other, which will be explained in detail in the following embodiments. In some embodiments, for the connecting lines 140, the width in the second direction D2, the thickness in the third direction D3, the material included, and the composition structure may be the same as or similar to the connecting lines 120a of the above embodiments, and details are not repeated herein.

In some embodiments, the distance between adjacent bridge members 150 may be greater than or equal to 2 mm and less than or equal to 30 mm. For example, the distance between adjacent bridge members 150 may be 2.5 mm, 5 mm, 10 mm, 15 mm, 20 mm, 25 mm, or 28 mm, but the disclosure is not limited thereto.

The gate driving circuit 400 is disposed in the display area AA, for example. In the present embodiment, the gate driving circuit 400 includes a gate driving circuit (gate driver on panel, GOP) disposed on the panel, but the disclosure is not limited thereto. The gate driving circuit 400 may be connected to the working connecting line 420, and the working connecting line 420 may be connected to the working signal line 410, so that the gate driving circuit 400 may be driven via the working signal line 410, wherein the working signal line 410 is extended along the first direction D1, and the working connecting line 420 is extended along the second direction D2. In some embodiments, the working signal line 410 is electrically connected to the second circuit board CB2 via the plurality of bridge members 430, the connecting lines 140, and the plurality of bridge members 150, but the disclosure is not limited thereto. Specifically, the plurality of bridge members 430, for example, penetrate through the substrate 210 and are electrically connected to the working signal line 410, so that the corresponding bridge members 430 may be connected to the corresponding bridge members 150. As a result, an electrical signal transmission path formed by the connecting lines 140, the bridge members 150, the bridge members 430, the working signal line 410, the working connecting line 420, and the gate driving circuit 40 is created. In some embodiments, each of the plurality of bridge members 430 corresponds to the plurality of bridge members 150 disposed on the support substrate 110, that is, the bridge members 150 may be, for example, at least partially overlapped and electrically connected to the corresponding bridge members 430. Moreover, in some embodiments, the plurality of working signal lines 410 may also be disposed spaced apart from each other in the first direction D1, and may be overlapped with the connecting lines 140 disposed on the support substrate 110, but the disclosure is not limited thereto.

Since the plurality of bridge members 430 on the panels 200b each correspond to the plurality of bridge members 150 disposed on the support substrate 110, in some embodiments, the distance between adjacent bridge members 430 may also be greater than or equal to 2 mm and less than or equal to 30 mm. For example, the distance between adjacent bridge members 430 may be 2.5 mm, 5 mm, 10 mm, 15 mm, 20 mm, 25 mm, or 28 mm, but the disclosure is not limited thereto.

It should be mentioned that, although two bridge members 430 electrically connected to one working signal line 410 on one panel 200b are shown in the present embodiment, the disclosure is not limited thereto. That is, in other embodiments, the number of the plurality of bridge members 430 electrically connected to one working signal line 410 may be more than two.

Figure 7:
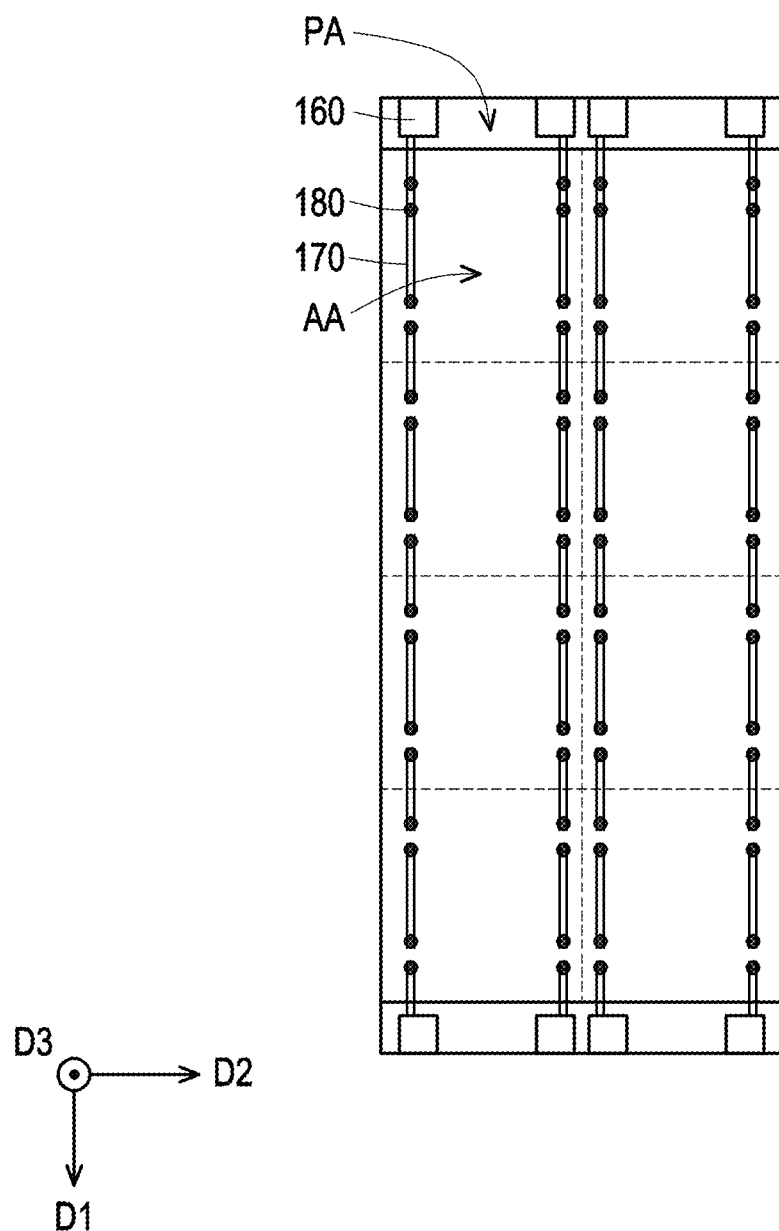
FIG. 7 is a schematic top view of an electronic device of some embodiments of the disclosure.

FIG. 7 is a schematic top view of an electronic device of some embodiments of the disclosure. It should be noted that, the embodiment of FIG. 7 may adopt the reference numerals and part of the content of the embodiments of FIG. 1 and FIG. 2A. The same or similar reference numerals are used to indicate the same or similar components, and the description of the same technical content is omitted.

Referring to FIG. 7, the main differences between an electronic device 30 of the present embodiment and the electronic device 10a are: the electronic device 30 further includes a plurality of test pads 160, a plurality of test connecting lines 170, and a plurality of test bridge members 180 disposed in the peripheral area PA. The plurality of test pads 160 may be disposed in the peripheral area PA on the support substrate 110, and the plurality of test connecting lines 170 may be disposed on the support substrate 110. In some embodiments, one of the plurality of test connecting lines 170 is extended substantially along the first direction D1 and connected to the corresponding test pad 160. The plurality of test bridge members 180 are, for example, disposed in the display area AA on the support substrate 110. In some other embodiments, at least a portion of the plurality of test bridge members 180 may be disposed in the peripheral area PA (not shown) on the support substrate 110. In some embodiments, one of the plurality of test bridge members 180 is electrically connected to the corresponding test connecting line 170. In addition, the plurality of test bridge members 180 may be disposed on each of the test connecting lines 170 along the first direction D1 and spaced apart from each other, but the disclosure is not limited thereto. Accordingly, when whether the signal transmission to the electronic device 30 is normal needs to be detected, the probes of a test device (not shown) may be electrically connected to the corresponding test pads 160, for example, in order to measure the signal transmitted on the corresponding test connecting lines 170 and test bridge members 180. Accordingly, in some embodiments, according to the signal information transmitted on the test connecting lines 170 obtained by the test device, the location of failure of the electronic device 30 may be further determined.

Based on the above, the electronic device provided by some embodiments of the disclosure includes a support plate and a plurality of panels disposed thereon, wherein the support plate includes a plurality of connecting lines extended along a specific direction and spaced bridge members electrically connected to one connecting line, and there is a plurality of bridge members of the support plate corresponding to the corresponding bridge members disposed on each panel. Accordingly, in a subsequent process or during use of the electronic device of an embodiment of the disclosure, when some of the connecting lines are broken due to reasons such as bending of the electronic device, or some of the bridge members of the support plate and/or the bridge members of the panel are defective and may not be electrically connected, additional signal transmission paths may be created by the arrangement of the plurality of connecting lines and/or the arrangement of the plurality of bridge members of the support plate and the bridge members of the panel. In this way, the failure of the electronic device of an embodiment of the disclosure due to inability to transmit signals may be reduced. Moreover, in the electronic device provided by some other embodiments of the disclosure, a redundancy connecting line electrically connected to a plurality of (e.g., two) bridge members of the support plate at the same time is also provided. When the connecting line located between the plurality of bridge members of the support plate is broken, signal transmission may still be implemented via another additional path provided by the redundancy connecting line, so as to reduce the failure of the electronic device of an embodiment of the disclosure due to the inability to transmit signals.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure. As long as the features between the embodiments do not violate the spirit of the disclosure or conflict with each other, they may be mixed and used arbitrarily.

What is claimed is:
1. An electronic device, comprising:
 a support plate comprising a first bridge member and a second bridge member; and
 a first panel disposed on the support plate, comprising:
  a substrate;
  a signal line disposed on the substrate,
  a third bridge member penetrating through the substrate and electrically connected to the signal line and the first bridge member; and a fourth bridge member penetrating through the substrate and electrically connected to the signal line and the second bridge member;
a second panel; and
a fifth bridge member,
wherein the support plate comprises a first connecting line, the first connecting line is connected to the second bridge member and the fifth bridge member, and the first panel and the second panel are electrically connected via the first connecting line,
wherein the support plate further comprises a redundancy connecting line, the redundancy connecting line is connected to the second bridge member and the fifth bridge member, and the redundancy connecting line and the signal line are not overlapped in a normal direction of the substrate.

2. The electronic device of claim 1, further comprising a circuit board, wherein the circuit board is disposed on the support plate and configured to provide a signal to the signal line.

3. The electronic device of claim 1, wherein a portion of the first connecting line is exposed by the first panel and the second panel.

4. The electronic device of claim 1, further comprising a second connecting line, wherein the second connecting line is connected to the first bridge member and the second bridge member.

5. The electronic device of claim 4, wherein the second connecting line comprises a multi-layer metal structure.

6. The electronic device of claim 5, wherein the second connecting line comprises a structure formed by a first metal layer and a second metal layer.

7. The electronic device of claim 6, wherein an insulating layer is disposed between the first metal layer and the second metal layer.

8. The electronic device of claim 4, wherein a material of the first connecting line and a material of the second connecting line comprise copper, molybdenum, aluminum, or a combination thereof.

9. The electronic device of claim 4, wherein the second connecting line is covered by one of the first panel and the second panel.

10. The electronic device of claim 4, wherein the support plate further comprises a support substrate, wherein the first bridge member, the second bridge member, and the second connecting line are disposed on the support substrate.

11. The electronic device of claim 1, wherein the first connecting line is extended along a first direction.

12. The electronic device of claim 11, wherein a width of the first connecting line in a second direction is greater than or equal to 25 microns and less than or equal to 55 microns, wherein the second direction is perpendicular to the first direction.

13. The electronic device of claim 1, further comprising an active area and a peripheral area, wherein the peripheral area is located on at least one side of the active area, and the first panel is disposed in the active area.

14. The electronic device of claim 13, wherein the peripheral area comprises a fan-out area, and the fan-out area is located on one side of the active area, wherein the circuit board is disposed in the fan-out area.

15. The electronic device of claim 1, further comprising a plurality of test pads, a plurality of test connecting lines, and a plurality of test bridge members disposed in the peripheral area, wherein one of the plurality of test connecting lines is connected to a corresponding test pad, and one of the plurality of test bridge members is electrically connected to a corresponding test connecting line.

16. The electronic device of claim 1, wherein a distance between the first bridge member and the second bridge member is greater than or equal to 2 mm and less than or equal to 30 mm.

17. The electronic device of claim 1, wherein a distance between the third bridge member and the fourth bridge member is greater than or equal to 2 mm and less than or equal to 30 mm.

18. The electronic device of claim 1, wherein the first panel further comprises a gate driving circuit, a working signal line, and a working connecting line, wherein the gate driving circuit is connected to the working connecting line, and the working connecting line is connected to the working signal line.

* * * * *